United States Patent [19]

Early

[11] Patent Number: 6,094,335
[45] Date of Patent: Jul. 25, 2000

[54] VERTICAL PARALLEL PLATE CAPACITOR

[75] Inventor: Kathleen R. Early, Santa Clara, Calif.

[73] Assignee: Advanced Micro Devices, Inc., Sunnyvale, Calif.

[21] Appl. No.: 09/169,338

[22] Filed: Oct. 9, 1998

[51] Int. Cl.$^7$ .......................... H01G 4/005; H01G 4/228; H01G 4/06
[52] U.S. Cl. ...................... 361/303; 361/305; 361/306.3; 361/313; 29/25.42
[58] Field of Search .................................... 361/303, 305, 361/306.1, 306.2–306.3, 311–313; 438/253, 239, 244, 396, 397, 398; 257/300, 303, 306–309, 528; 29/29.42

[56] References Cited

U.S. PATENT DOCUMENTS

| | | | |
|---|---|---|---|
| 5,006,909 | 4/1991 | Kosa . | |
| 5,583,359 | 12/1996 | Ng et al. | 257/306 |
| 5,705,438 | 1/1998 | Tseng | 438/238 |
| 5,712,813 | 1/1998 | Zhang | 365/149 |
| 5,789,289 | 8/1998 | Jeng | 438/253 |
| 5,940,713 | 8/1999 | Green | 438/396 |
| 5,998,260 | 12/1999 | Lin | 438/254 |

*Primary Examiner*—Hyung-Sub Sough
*Assistant Examiner*—Anthony Dinkins
*Attorney, Agent, or Firm*—Amin, Eschweiler & Turocy, LLP

[57] ABSTRACT

A method for fabricating a vertical parallel plate capacitor is provided. In the method, a sacrificial layer is formed on at least a portion of a surface. A dielectric layer is conformally formed on the sacrificial layer and an exposed portion of the surface. The dielectric layer is etched so as to leave substantially only a fence of dielectric material along a sidewall of the sacrificial layer. The sacrificial layer is removed, and a conductive layer is deposited on the fence and surface. The conductive layer is etched and planarized so as to form a first capacitor plate along one side of the fence, and a second capacitor plate along the other side of the fence, the first and second capacitor plates being substantially parallel to each other, and transverse sections of the capacitor plates including elongated portions substantially normal to the surface.

26 Claims, 13 Drawing Sheets

VERTICAL PARALLEL PLATE CAPACITOR

TECHNICAL FIELD

The present invention generally relates to capacitor fabrication, and in particular to a method of fabricating a vertical parallel plate capacitor for use in integrated circuits.

BACKGROUND OF THE INVENTION

There is an increasing demand for miniaturization in the integrated circuits industry. This demand has led to an ever increasing reduction in size and separation between devices (e.g., capacitors) of an integrated circuit (IC) in order to reduce IC size and/or increase density. As capacitor size decreases, it becomes more difficult to sustain sufficient charge for the intended use of the capacitor as well as store the charge for a sufficient period of time.

Figure 1:
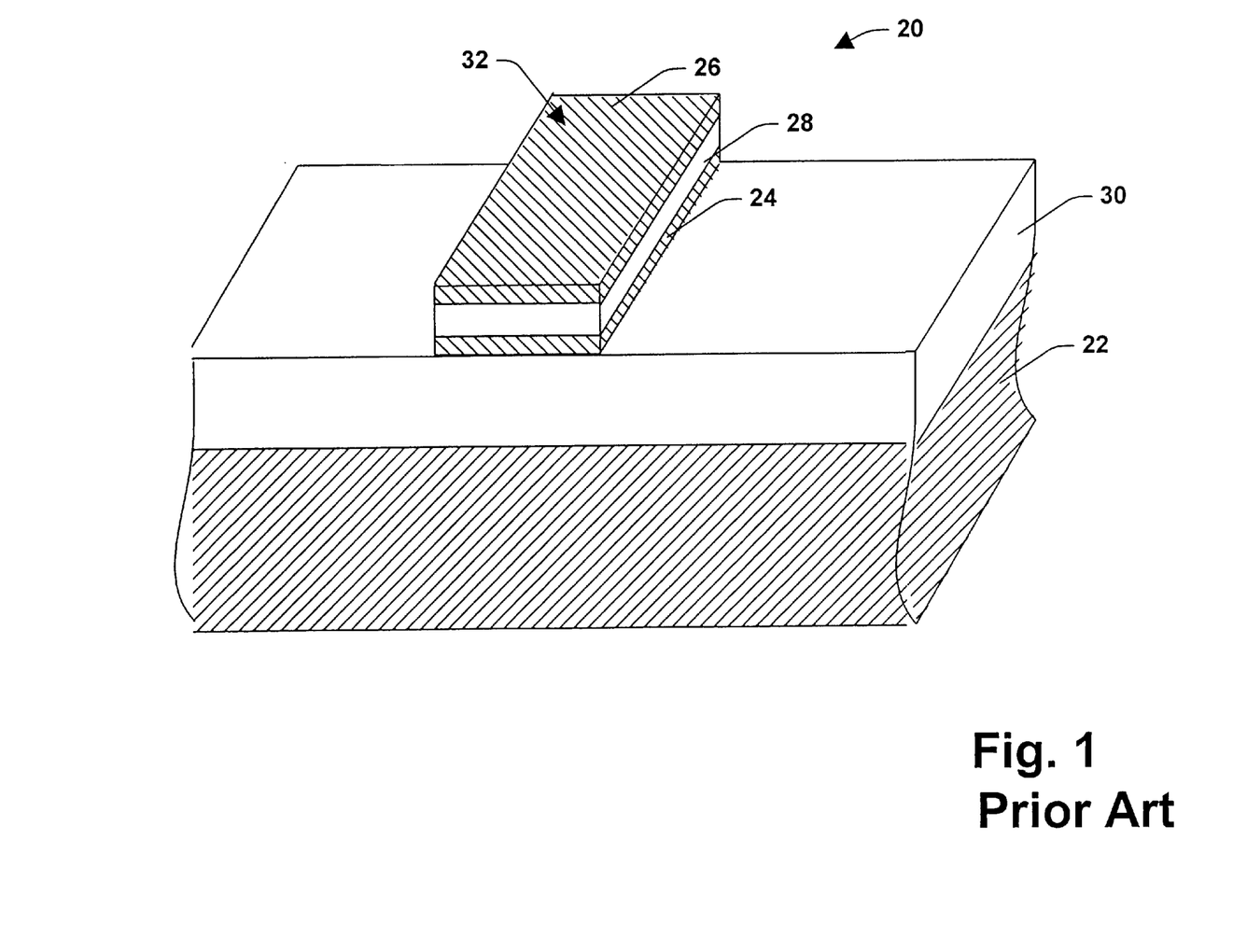
FIG. 1 is a perspective illustration of a prior art capacitor structure.

FIG. 1 illustrates a conventional stacked capacitor structure 20 fabricated on a semiconductor substrate 22. The structure 20 includes a first electrode 24 and second electrode 26, and a capacitor dielectric 28 interposed therebetween. In fabricating this structure, typically, a first dielectric layer 30 is provided on the substrate 22, and a first conductive layer, typically polysilicon, is deposited and patterned to define the bottom capacitor electrode 24. A layer of dielectric is deposited over the bottom electrode to provide the capacitor dielectric 28. A second conductive layer, such as polysilicon, is deposited thereon to define the top capacitor electrode 26.

As is readily apparent, the amount of surface area utilization is substantially affected by the size of the capacitor plate face 32 (which in the case of the first electrode 24 is in contact with the insulation layer 30). Thus, reducing the overall size of the capacitor 20 is one way to increase overall capacitor density of an IC.

Since market forces are driving the integrated circuitry towards increasing the density of capacitors on an IC in order to maximize IC substrate surface utilization, it would be desirable to have a capacitor structure, which facilitates such increasing of capacitor density, and a method for making the same.

SUMMARY OF THE INVENTION

The present invention provides for a vertical parallel plate capacitor structure which facilitates increasing capacitor density of an integrated circuit. The capacitor structure includes first and second electrode plates, which are substantially parallel to each other. A dielectric material is interposed between the first and second electrode plates. Transverse sections of the first and second electrode plates and the dielectric material have elongated portions substantially normal to a common surface. The vertical parallel plate capacitor structure occupies significantly less IC substrate surface area than many conventional large area capacitors, and thus the capacitor structure of the present invention facilitates increasing capacitor density in an IC.) Moreover, the capacitor structure of the present invention provides for sustaining a desired charge and storing the charge for a period of time sufficient to carry out the intended purpose of the capacitor.

The capacitor structure is fabricated by forming a sacrificial layer on a portion of an insulated substrate surface. A dielectric material is conformally formed on the sacrificial block and an exposed portion of the substrate surface. As a result, a dielectric fence is also formed conformally along a sidewall of the sacrificial layer. The dielectric layer is substantially removed so that only the dielectric fence against the sidewall of the sacrificial layer remains. The sacrificial layer is removed to leave the fence of dielectric material projecting substantially normal from the insulated substrate surface. Stretchers may be employed to support dielectric fences having high aspect ratios. A conductive layer is deposited over the dielectric fence. The conductive layer is etched and planarized so as to form two substantially parallel capacitor plates on each side of the dielectric fence to complete the vertical parallel plate capacitor of the present invention in relevant part.

One aspect of the present invention relates to a vertical parallel plate capacitor. The capacitor includes first and second electrode plates, the first electrode plate being substantially parallel to the second electrode plate. A dielectric material is interposed between the first and second electrode plates. Transverse sections of the first and second electrode plates include elongated portions normal to a common surface.

Another aspect of the present invention relates to a method for fabricating a vertical parallel plate capacitor. In the method, a fence of dielectric material is formed on a surface; A conductive layer is formed over the fence and surface. The conductive layer is etched so as to form a first capacitor plate along a first side of the fence, and a second capacitor plate along a second side of the fence.

Still another aspect of the present invention relates to a method for fabricating a vertical parallel plate capacitor. In this method, a sacrificial layer is formed on at least a portion of a surface. A dielectric layer is conformally formed on the sacrificial layer and an exposed portion of the surface. The dielectric layer is etched so as to leave a fence of dielectric material along a sidewall of the sacrificial layer. The sacrificial layer is removed and a conductive layer is formed on the fence and surface. The conductive layer is etched so as to form a first capacitor plate along one side of the fence, and a second capacitor plate along the other side of the fence, the first and second capacitor plates being substantially parallel to each other, and transverse sections of the capacitor plates including elongated portions substantially normal to the surface.

Another aspect of the invention relates to a vertical parallel plate capacitor including: first and second electrode plates, the first electrode plate being substantially parallel to the second electrode plate along first and second common axes, the first common axis being substantially perpendicular to the second common axis. A dielectric material is interposed between the first and second electrode plates. The first and second electrode plates are formed on an insulated substrate such that the first common axis is substantially normal to the insulated substrate.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with reference to the drawings, wherein like reference numerals are used to refer to like elements throughout. The method of the present invention will be described with reference to the formation of a vertical parallel plate capacitor structure. The following detailed description is of the best mode presently contemplated by the inventor for practicing the invention. It should be understood that the description of this preferred embodiment is merely illustrative and that it should not be taken in a limiting sense.

Figure 2:
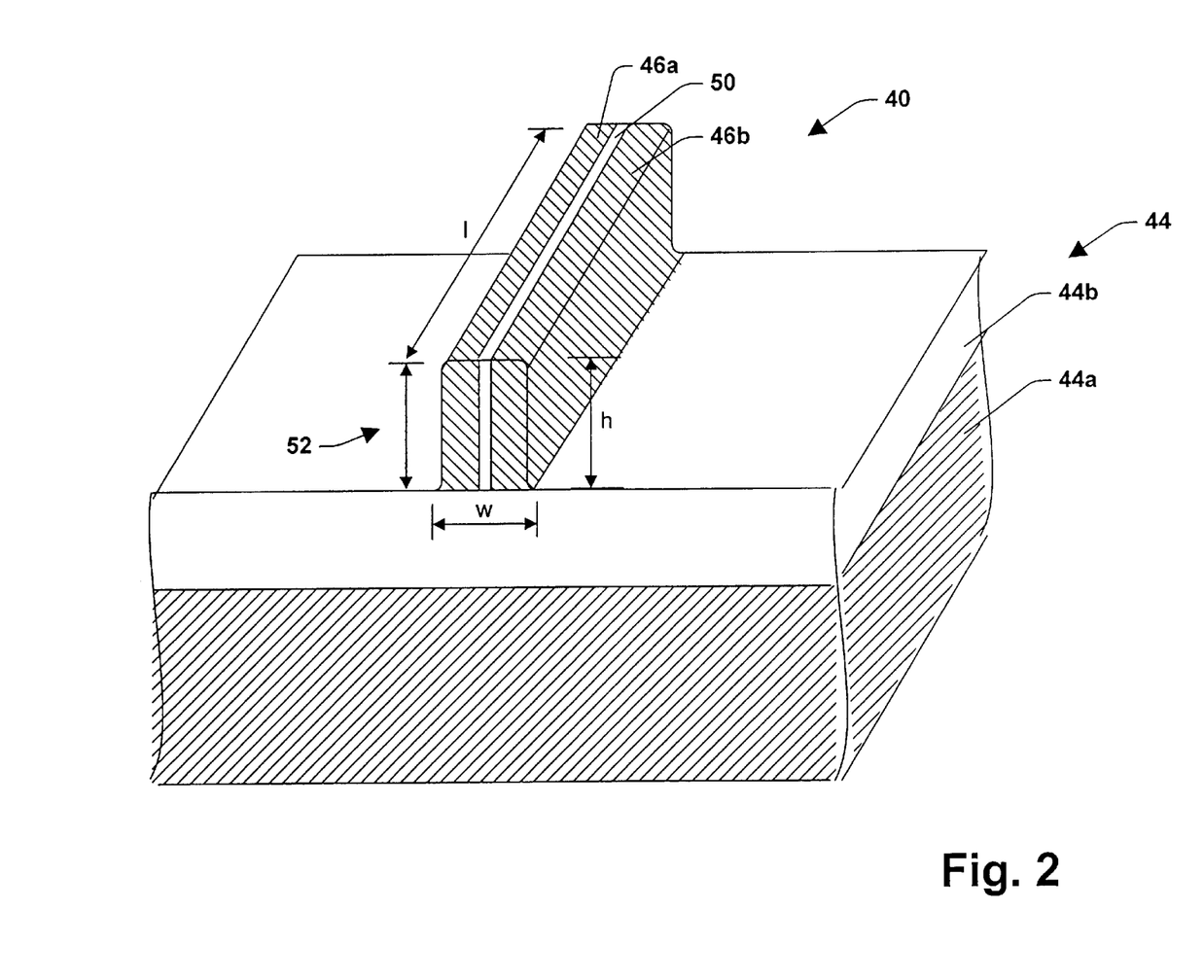
FIG. 2 is a perspective illustration of a capacitor structure in accordance with the present invention.

Referring initially to FIG. 2, a representative perspective illustration is shown of a vertical parallel plate capacitor structure 40 in accordance with the present invention. The capacitor structure 40 is shown formed over an insulated substrate 44, which includes a substrate layer 44a and an insulation layer 44b formed thereon. The capacitor structure 40 includes first and second electrode plates 46a and 46b, which are substantially parallel to each other. A dielectric material 50 is interposed between the first and second electrode plates 46a, 46b. The capacitor structure 40 has a height "h", width "w" and length "l". Transverse sections (which include the "h" and "W" dimensions of the structure 40) of the first and second electrode plates 46a, 46b and the dielectric material 50 have elongated portions 52 substantially normal to the insulated substrate 44. As can be seen, the height of the structure 40 is substantially greater than the width. However, if desired, the structure 40 may be fabricated so as to have a low aspect ratio (i.e., width >height).

The capacitor structure 40 occupies substantially less substrate surface area than the large area capacitor structure 20 shown in FIG. 1. Thus, the capacitor structure 40 provides for increasing capacitor density on an IC without sacrificing capacitor size as compared to the prior art capacitor 20. Moreover, the capacitor structure 40 of the present invention provides for sustaining a desired charge and storing the charge for sufficient period of time so that the capacitor structure 40 can perform its intended function. Additionally, the vertical orientation of the capacitor plates 46a, 46b of the capacitor 40 is highly conducive to some multi-level interconnect applications in part because of the ease of making electrical contact with both electrodes 46a, 46b.

Figure 3:
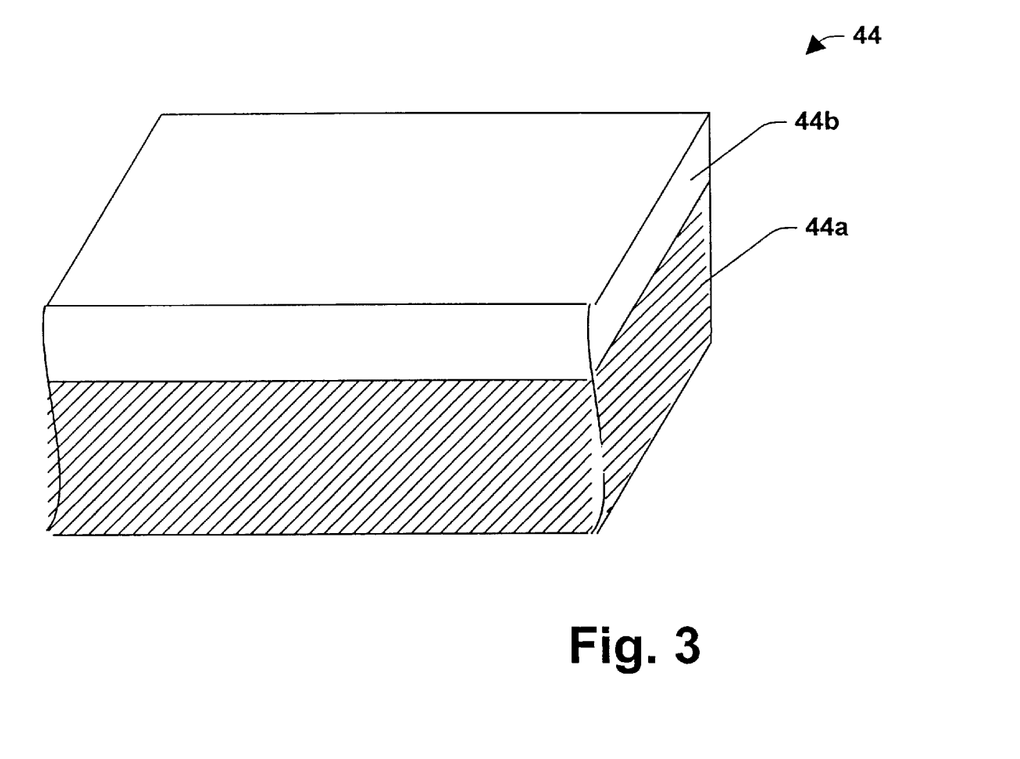
FIG. 3 is a perspective illustration of an insulating layer formed over a substrate surface in accordance with the present invention.

Steps for fabricating the vertical parallel plate capacitor structure 40 will now be discussed. Turning initially to FIG. 3, the substrate layer 44a is shown with an insulating layer 44b formed thereon. The insulating layer 44b is formed on the substrate 44a via a suitable deposition technique such as for example using furnace oxidation, ion implantation, chemical vapor deposition (CVD) or by a spinning technique. Both the insulating layer 44b and substrate 44a are referenced in common as insulated substrate 44 for sake of brevity.

Figure 4:
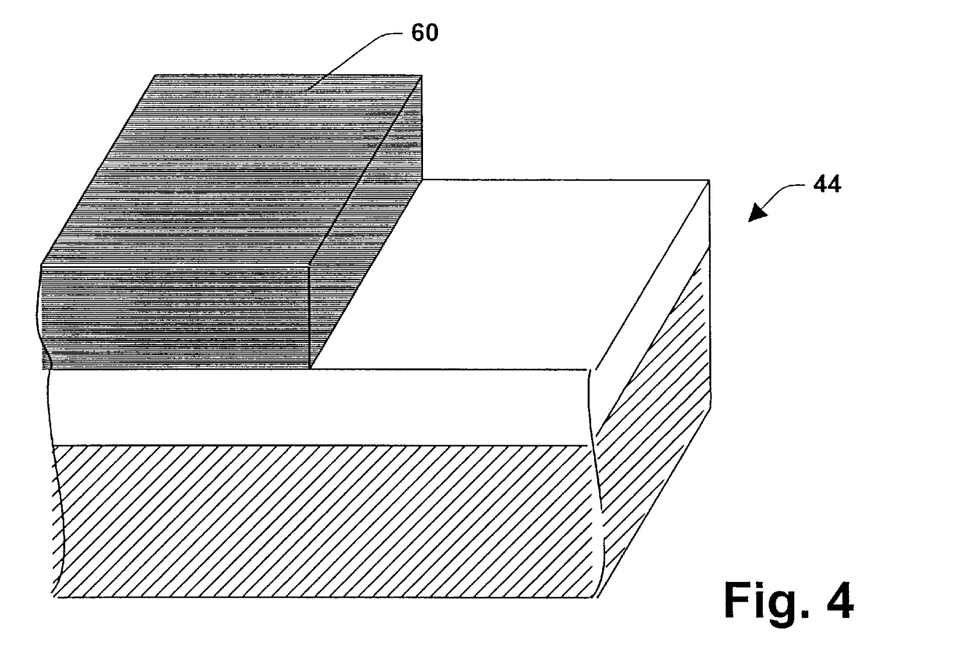
FIG. 4 is a perspective illustration of a sacrificial layer formed over a portion of the insulating layer of FIG. 3 in accordance with the present invention.

Referring now to FIG. 4, a sacrificial layer 60 is shown formed on a portion of the insulated substrate 44 using conventional chemical vapor deposition (CVD), evaporation sputtering or other similar process. The sacrificial layer 60 may include any suitable material, metal, semiconductor or dielectric, that can be selectively removed from the underlying insulated substrate 44 (and/or device layers if applicable) without damage. The sacrificial layer 60 is selected such that the insulated substrate 44 (and/or device facet if applicable) is not unduly damaged by application or removal of the sacrificial layer 60 and can withstand processing temperatures required for the subsequently deposited dielectric layer (FIG. 5), which may be as high as or exceed 900° C. An example of a compound material suitable for the sacrificial layer 60 is silicon, although there are many other materials that may be utilized in the successful practice of this invention. The thickness of the sacrificial layer 60 may be tailored in accordance with the desired height of the capacitor structure 40.

Figure 5:
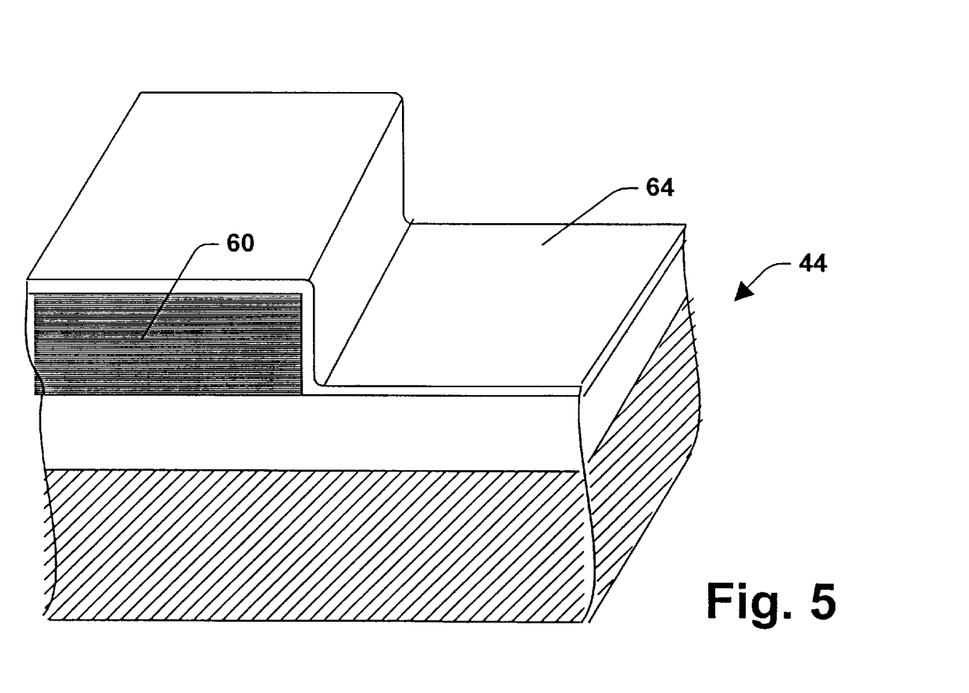
FIG. 5 is a perspective illustration of a dielectric layer formed over the sacrificial layer and exposed insulated substrate of FIG. 4 in accordance with the present invention.

Turning now to FIG. 5, a dielectric layer 64 is shown conformally formed on the sacrificial layer 60 and exposed portion of the insulated substrate 44. Any suitable dielectric material (e.g., silicon dioxide, silicon nitrides, silicon oxynitrides, polyimides, Teflon, aerogels and the like) may be employed to carry out the present invention. One method of forming the dielectric layer 64 is to conformally grow or deposit the dielectric layer 64 using thermal oxidation of silicon, for example, in an oxidizing ambient. Low pressure CVD may also be used to deposit a conformal layer of dielectric material for the dielectric layer 64. The thickness of the dielectric layer 64 may be suitably tailored in accordance with dielectric material characteristics and desired performance parameters of the capacitor structure 40.

Figure 6:
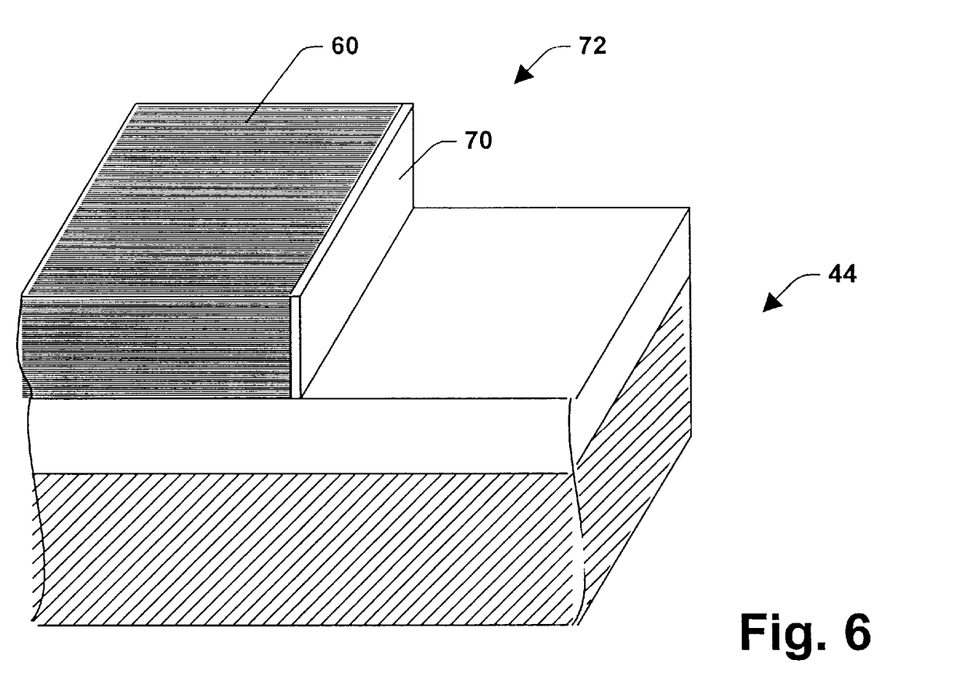
FIG. 6 is a perspective illustration of the dielectric layer after being etched to form a fence of dielectric material along a sidewall of the sacrificial layer in accordance with the present invention.

FIG. 6 illustrates the dielectric layer 64 substantially etched away to leave a fence of dielectric material (dielectric fence 70) along a sidewall 72 of the sacrificial layer 60. The etching of the dielectric layer 64 is performed (e.g., via anisotropic etching, reactive ion etching) such that the dielectric material on the top surface of both the sacrificial layer 60 and insulated substrate 44 is substantially removed. The only remaining dielectric material is that which is conformally formed along the sidewall 72 of the sacrificial layer 60. The etching is performed substantially normal to the surface of the insulated substrate 44 with little if any lateral etching. It is to be appreciated that the side of the sacrificial layer 60 opposite to sidewall 72 may be employed to form another fence of dielectric material if desired, or the opposite side may simply extend to the edge of the substrate layer 44.

Figure 7A:
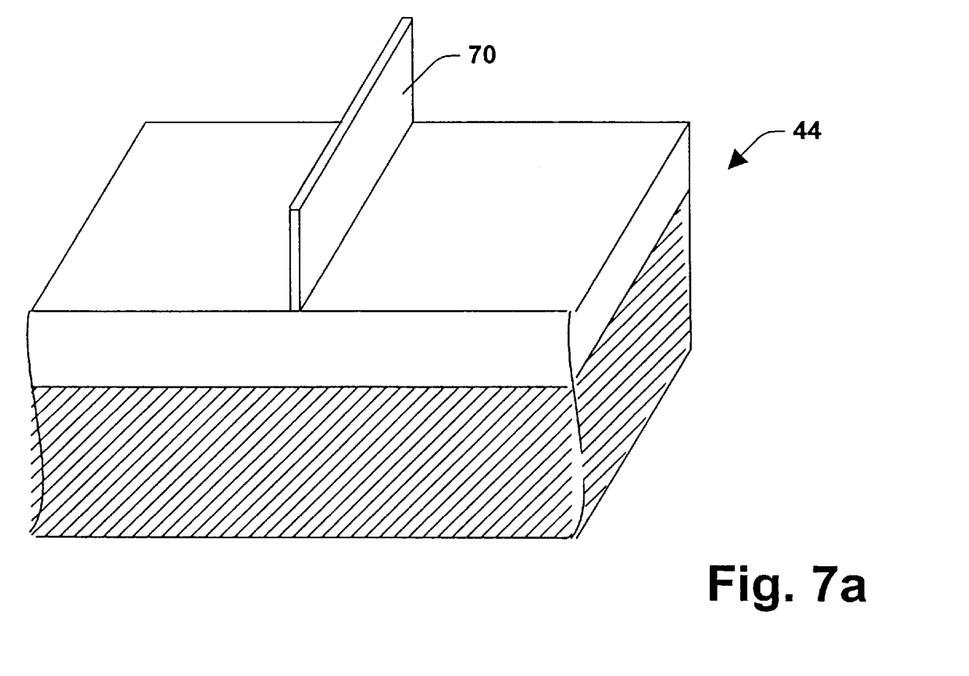
FIG. 7a is a perspective illustration of the fence of dielectric material after the sacrificial layer has been removed in accordance with the present invention.
Figure 7B:
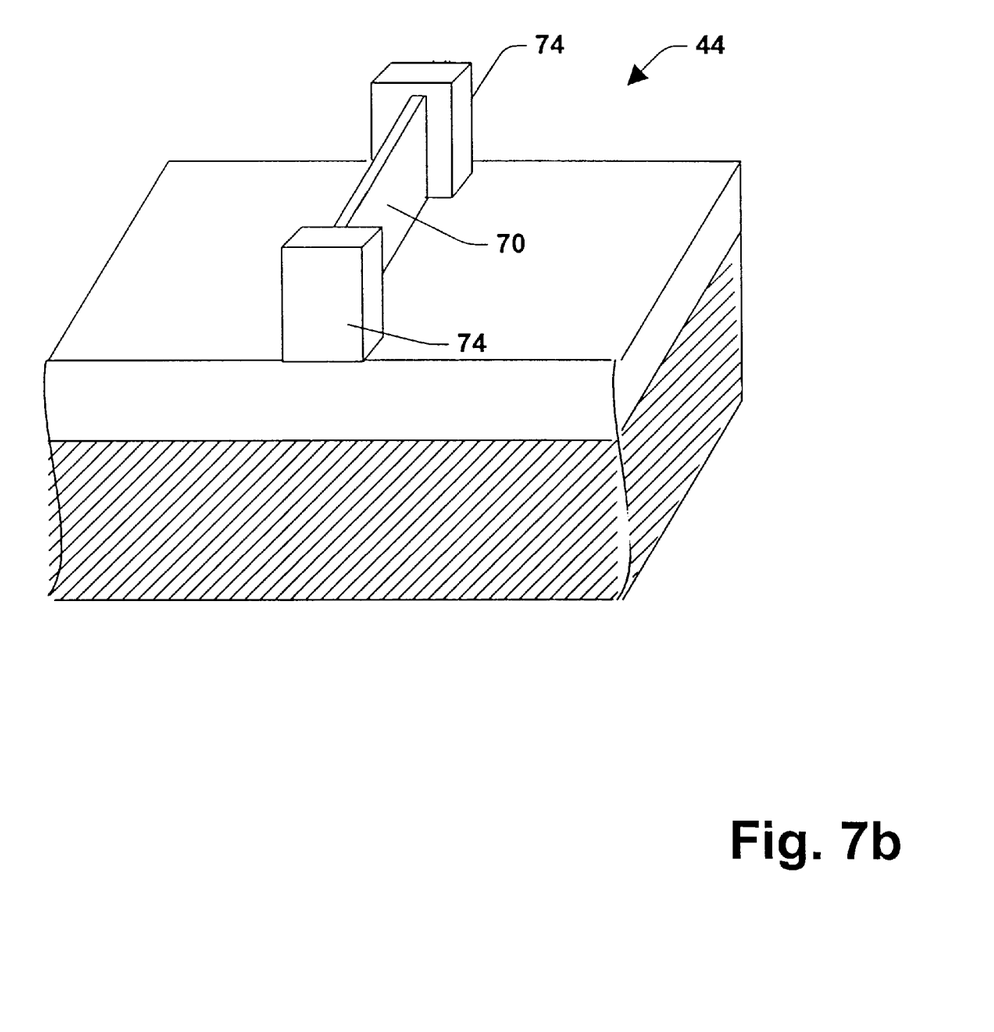
FIG. 7b is a perspective illustration of the fence of dielectric material being supported by stretchers in accordance with the present invention.

In FIG. 7a, the sacrificial layer 60 is shown removed. Any suitable technique for removing (e.g., via photolithographic techniques followed by either wet or dry etching) the sacrificial layer may be employed. What remains thereafter is the dielectric fence 70. If needed, a furnace anneal may be performed to heal any damage done to the fence 70 during the etching step. It will be appreciated that for high aspect ratio applications of the dielectric fence, stretchers 74 (FIG. 7b) may be employed to provide structural support to the dielectric fence 70 so that the fence 70 does not fall over and/or apart. Oxide and/or silicon may be employed as a compatible material for the stretchers 74, for example. One skilled in the art could easily effect usage of such stretchers 74 in accordance with the teachings herein, and therefore further discussion related thereto is omitted for sake of brevity.

It is also to be appreciated that a plurality of stretchers may be employed to selectively delineate a plurality of capacitors along the length "l" direction of the capacitor structure 40, which may be connected in parallel or series as desired.

Figure 8:
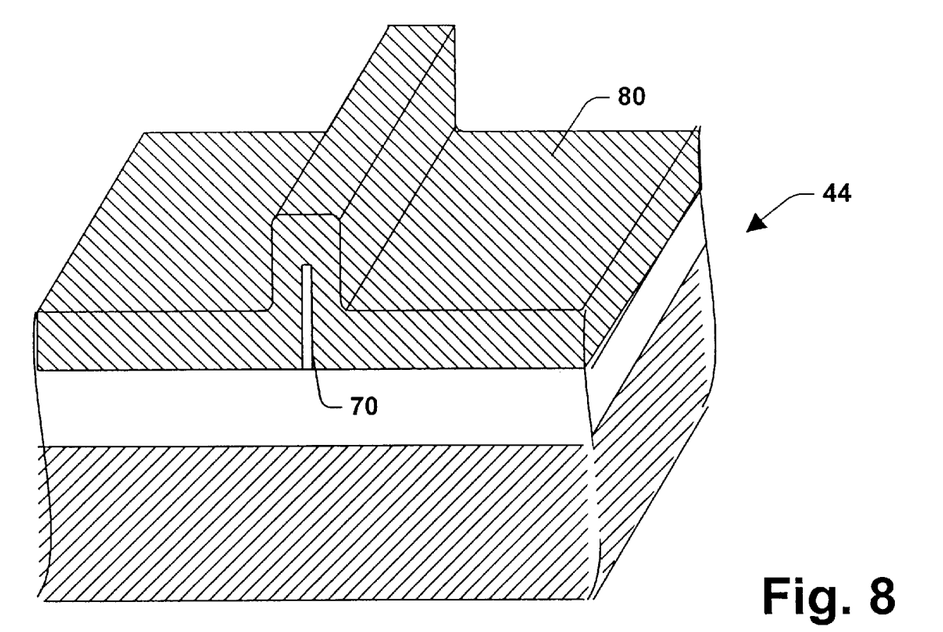
FIG. 8 is a perspective illustration of a conductive layer formed over the fence of dielectric material and exposed insulated substrate in accordance with the present invention.

FIG. 8 illustrates a conductive layer 80 conformally formed on the dielectric fence 70 and the insulated substrate 44. The conductive layer 80 may include metals, metal alloys, semiconductors, amorphous silicon, poly crystalline silicon, highly doped polysilicon or any other suitable material for a capacitor electrode in accordance with the present invention. For example, the conductive layer 80 may include at least one of: titanium, titanium alloys, tungsten, tungsten alloys, aluminum, aluminum alloys, copper, copper alloys, compound semiconductors and polycrystalline silicon. Furthermore, it is to be appreciated that at least two different materials may be stacked in forming the conductive layer 80—each of the respective materials imparting functional characteristics thereof to the conductive layer 80. The conductive layer 80 may be formed by any of a variety of suitable techniques (e.g., chemical vapor deposition (CVD) processes including low pressure chemical vapor deposition (LPCVD) and plasma enhanced chemical vapor deposition (PECVD), melting, sputtering and the like). The thickness of the conductive layer 80 may be suitably tailored in accordance with the chosen material(s) for the conductive layer 80 and the desired performance characteristics of the capacitor structure 40.

Figure 9:
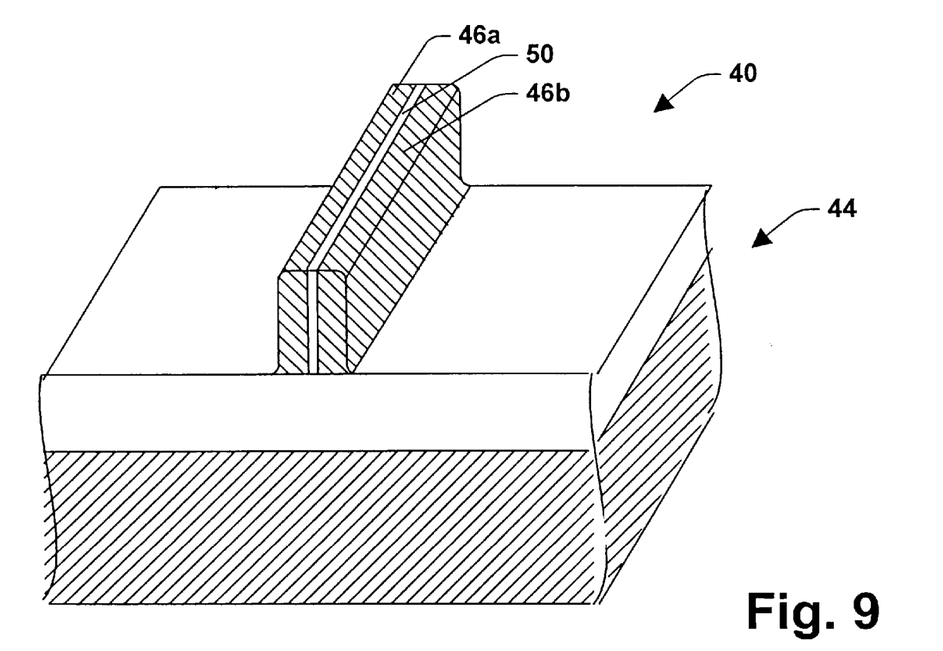
FIG. 9 is a perspective illustration of a vertical parallel plate capacitor substantially complete in relevant part in accordance with the present invention.

The conductive layer 80 is then anisotropically etched to result in the substantially complete vertical parallel plate capacitor structure 40 shown in FIG. 9. It is to be appreciated that appropriate photolithographic and etching steps are performed so as to electrically isolate the first electrode plate 46a from the second electrode plate 46b. If desired, additional photolithographic steps may be performed prior to etching the conductive layer 80 so as to pattern traces from the conductive layer 80 to and from the electrode plates 46a and 46b to serve as electrical connections between various devices formed on the substrate 44.

Figure 10:
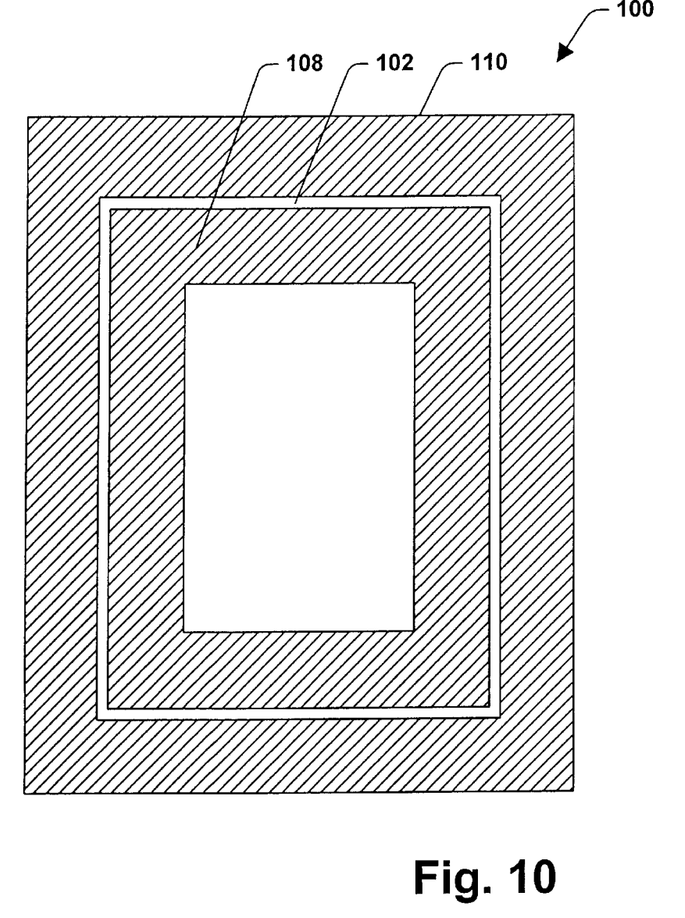
FIG. 10 is a top view of structure in accordance with the present invention.
Figure 11:
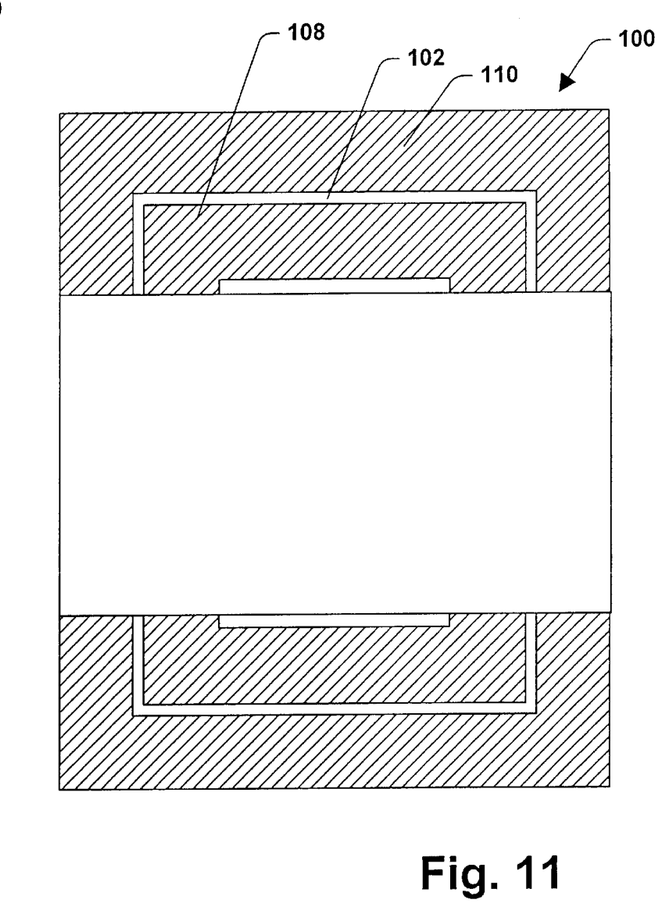
FIG. 11 is a top view of the structure of FIG. 10 being partially covered by a mask in accordance with the present invention.
Figure 12:
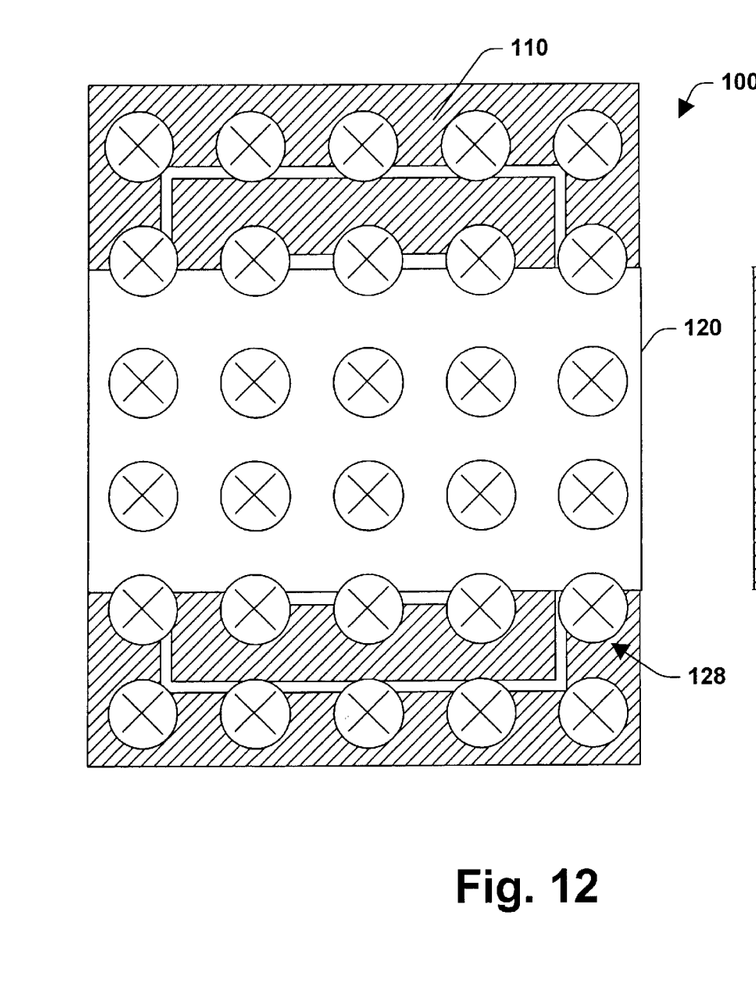
FIG. 12 is a top view of the structure of FIG. 11 undergoing an etching step in accordance with the present invention.
Figure 13:
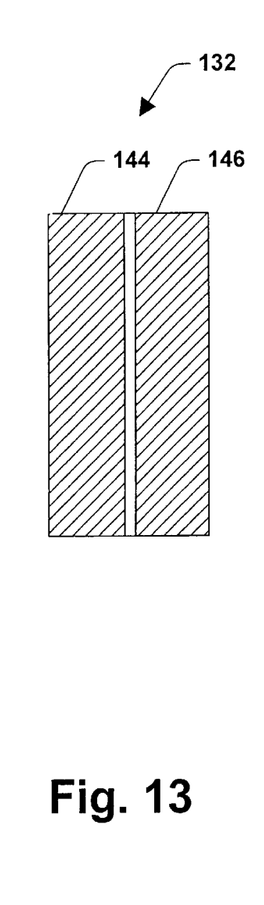
FIG. 13 is a top view of substantially complete electrically isolated capacitor structures in accordance with the present invention.

FIGS. 10–13 illustrate one specific embodiment for electrically isolating capacitor structures in accordance with the present invention. FIG. 10 is a top view of a structure 100 including an ONO region 102 interposed between two conductive regions 108 and 110, which were formed in accordance with the discussion above. The structure 100 will be formed into two capacitor structures 130 and 132 (FIG. 13). Turning now to FIG. 11, a mask 120 is formed over the structure 100 using suitable photolithographic processes. The mask 120 will serve to define the two capacitor structures 130 and 132. In FIG. 12, an etching step 128 is performed to remove the portions of the structure 100 not shielded by the mask 120. What remains after the etching process 128 and any cleanup process that may be required are the two capacitor structures 130 and 132. As can be seen in FIG. 13, the two capacitor structures 130 and 132 are electrically isolated from one another as a result of the etching step 128. Furthermore, capacitor plates 140, 142, 144 and 146 are respectively isolated within each respective capacitor structure 130 and 132.

Figure 14:
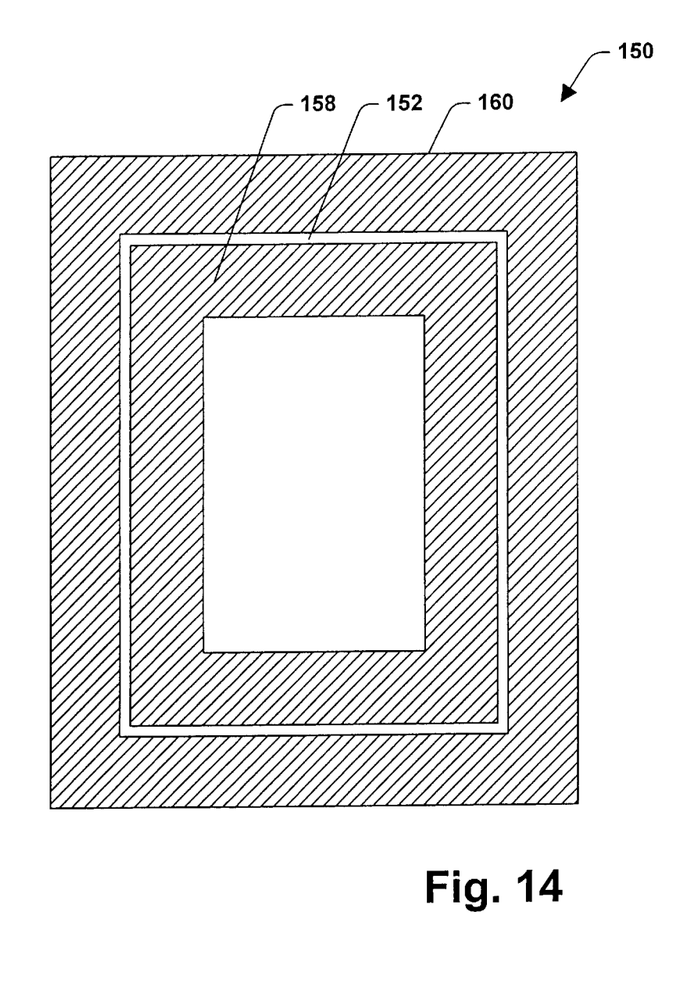
FIG. 14 is a top view of structure in accordance with the present invention.
Figure 15:
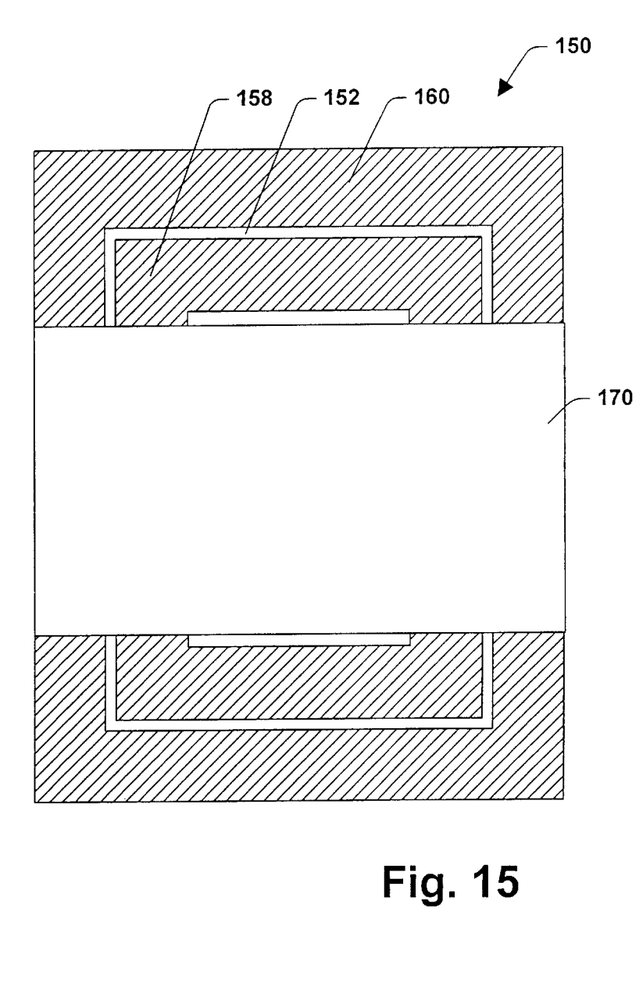
FIG. 15 is a top view of the structure of FIG. 14 being partially covered by a mask in accordance with the present invention.
Figure 16:
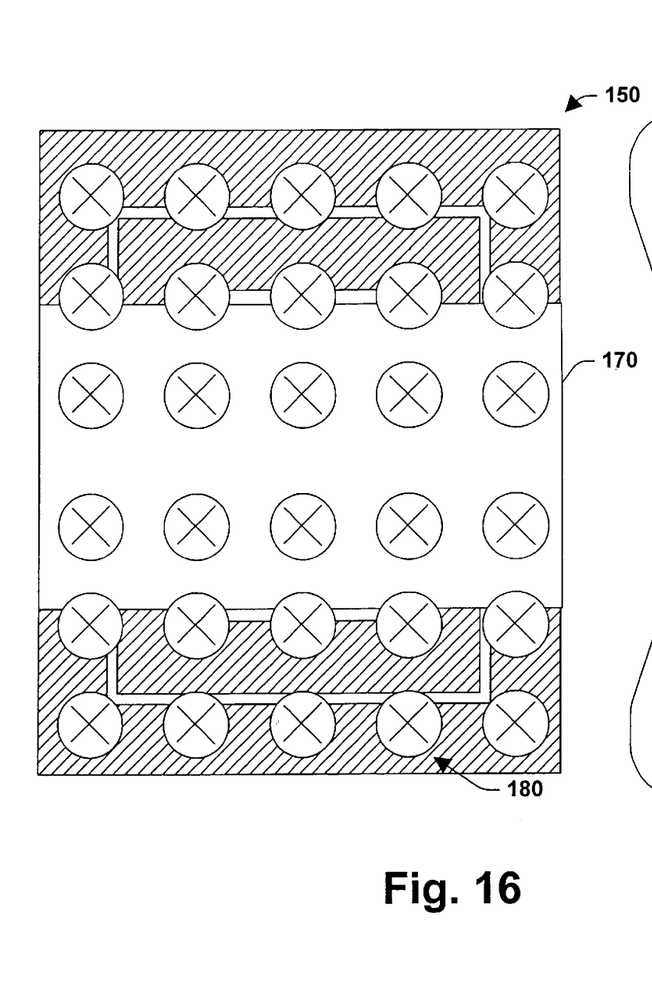
FIG. 16 is a top view of the structure of FIG. 15 undergoing an oxidizing step in accordance with the present invention.
Figure 17:
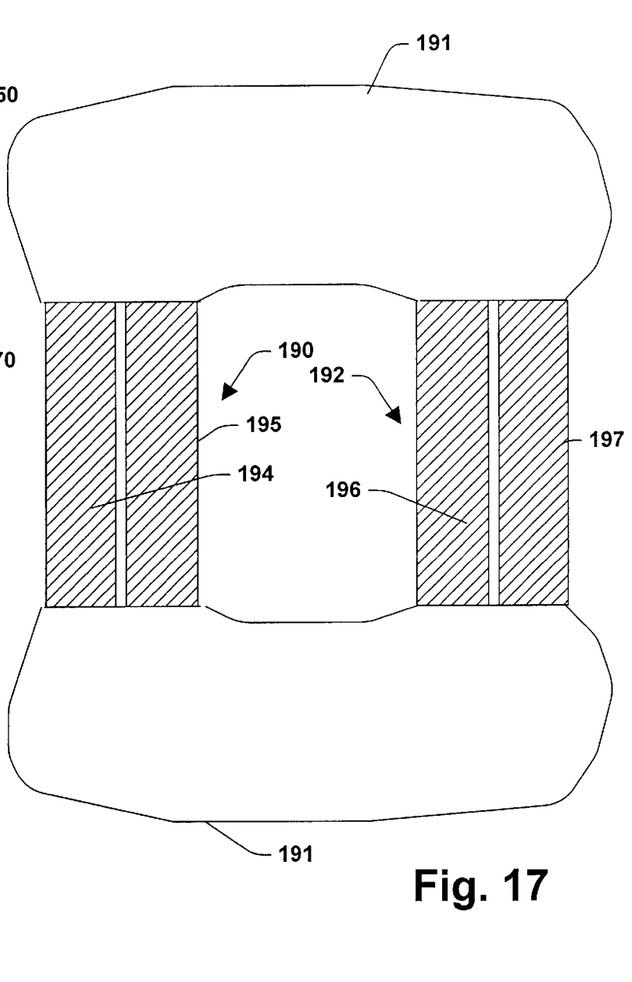
FIG. 17 is a top view of substantially complete electrically isolated capacitor structures in accordance with the present invention.

FIGS. 14–16 illustrate another embodiment for electrically isolating capacitor structures. FIG. 14 is a top view of a structure 150 including an ONO region 152 interposed between two conductive regions 158 and 160, which were formed in accordance with the discussion above. The structure 150 will be formed into two capacitor structures 190 and 192 (FIG. 17). Turning now to FIG. 15, a mask 170 is formed over the structure 150 using suitable photolithographic processes. The mask 150 will serve to define the two capacitor structures 190 and 192. An oxidation step 180 (FIG. 16) is performed to oxidize the portions of the structure 150 not shielded by the mask 170. The oxidation step transforms the unmasked portions of the structure 150 into oxides and/or oxide compounds 191 that are not electrically conductive. An exemplary discussions relating to transforming conductive materials into nonconductive materials via oxidation are presented in U.S. patent application Ser. Nos. 09/009,909 now U.S. Pat. No. 5,939,750, 09/033,723; 09/033,916 now U.S. Pat. No. 6,043,120 and 09/033,836, the entireties of which are incorporated herein by reference. As can be seen in FIG. 17, the two capacitor structures 190 and 192 are electrically isolated from one another as a result of the oxidizing step 128. Furthermore, capacitor plates 194, 195, 196 and 197 are respectively isolated within each respective capacitor structure 190 and 192.

Figure 18:
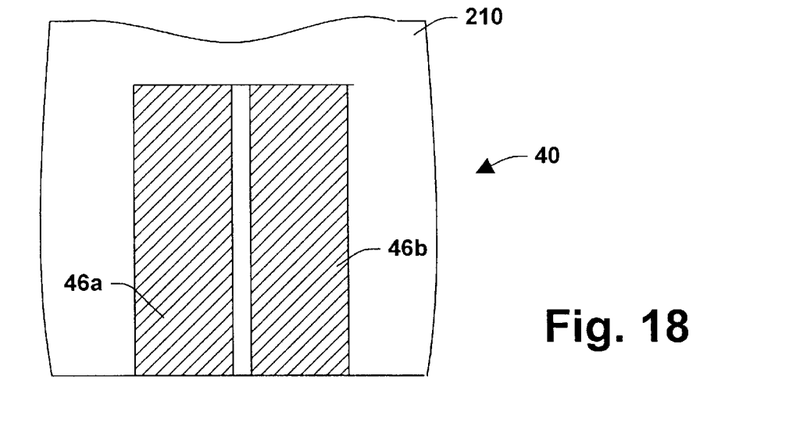
FIG. 18 is a cross-sectional view of a capacitor structure covered by an insulating material in accordance with the present invention.
Figure 19:
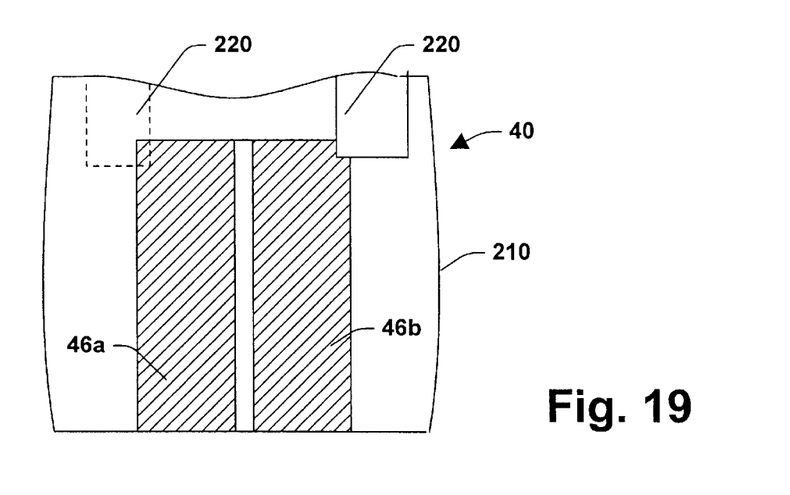
FIG. 19 is a cross-sectional view of the capacitor structure of FIG. 18 wherein vias have been formed through the insulating material and partially through portions of capacitor plates of the capacitor structure in accordance with the present invention.
Figure 20:
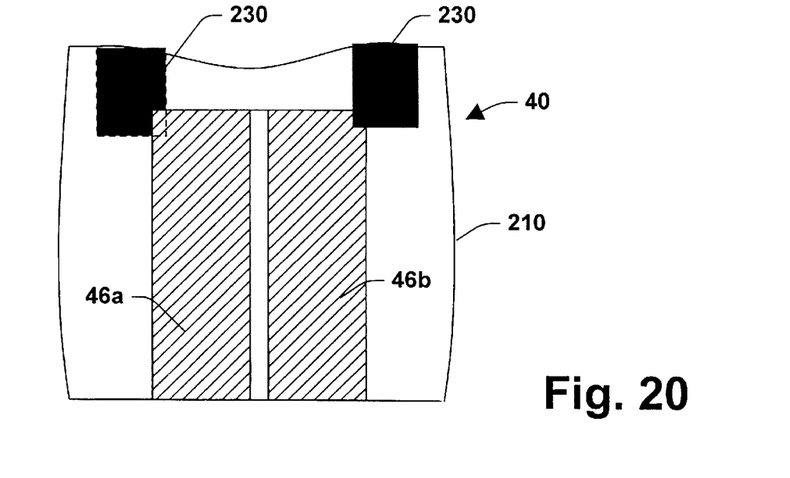
FIG. 20 is a cross-sectional view of the capacitor structure of FIG. 19 wherein the vias have been filled with an electrically conductive plug material so as to form electrical contacts to the capacitor structure in accordance with the present invention.
Figure 21:
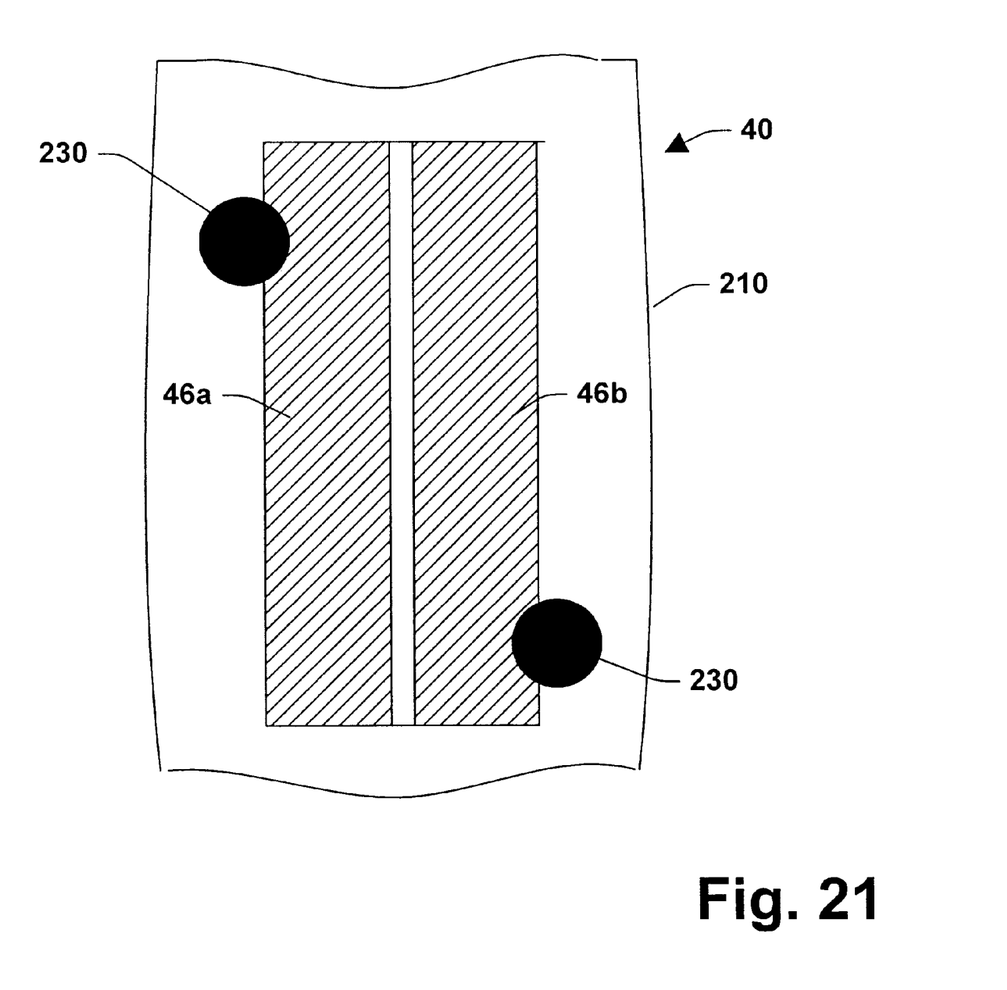
FIG. 21 is a top view of the capacitor structure of FIG. 20 in accordance with the present invention.

FIGS. 18–21 illustrate one specific embodiment relating to forming electrical contacts with the capacitor structure 40 (FIG. 1). FIG. 18 shows the capacitor structure 40 covered by an insulating material 210 (e.g., SiO$_2$). Vias 220 are formed in the insulating material 210 as shown in FIG. 19 from the surface of the insulating material 210 down through at a least a portion of the capacitor plates 46a and 46b, respectively. Thereafter, as shown in FIG. 19 the vias 220 are filled with conductive plug material (e.g., tungsten) to form electrical contacts 230 which provide electrical contact to the respective capacitor plates 46a and 46b. Formation of vias and filling vias with electrically conductive plug material is well known in the art and further discussion related thereto is omitted for sake of brevity. FIG. 21 is a top view of the capacitor structure 40 after the electrical contacts 230 have been formed.

The capacitor structure 40 provides for increasing capacitor density on an IC substrate as compared with the density allowable for large area capacitor structures—a large area is sometimes necessary to sustain charge for a sufficient period of time. It is to be appreciated that the capacitor structure 40 and the method for making the same have wide applicability in integrated circuit applications as well as other areas such as micro-electro-mechanical systems, for example. All such applications are intended to fall within the scope of the hereto appended claims.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A vertical parallel plate capacitor, comprising:
   first and second electrode plates, the first electrode plate being substantially parallel to the second electrode plate;
   a dielectric material interposed between the first and second electrode plates;
   wherein transverse sections of the first and second electrode plates include elongated portions normal and integral to a common surface.

2. The capacitor of claim 1, wherein a transverse section of the dielectric material includes an elongated portion normal to the common surface.

3. The capacitor of claim 1, the common surface being an insulated substrate.

4. The capacitor of claim 1, the first electrode plate, comprising at least one of: a metal, metal alloys, compound semiconductors, amorphous silicon, highly doped polysilicon and polycrystalline silicon.

5. The capacitor of claim 1, the first electrode plate, comprising a stack of at least two different materials.

6. The capacitor of claim 1, the dielectric material comprising at least one of: polyimides, polytetrafluoroethylene aerogels, SiO$_2$, Si$_3$N$_4$, ONO, tantalum pentoxide and silicon oxynitride.

7. The capacitor of claim 1 in combination with a multi-level interconnect system of an integrated circuit.

8. The capacitor of claim 1 in combination with a computer.

9. A method for fabricating the vertical parallel plate capacitor of claim 1, comprising the steps of:
   forming a fence of dielectric material on a surface;
   forming a conductive layer over the fence and surface;
   etching the conductive layer so as to form the first electrode plate along a first side of the fence, and the second electrode plate along a second side of the fence.

10. The method of claim 9 further including a step of using a sacrificial layer in forming the fence of dielectric material.

11. The method of claim 9 further including an annealing step to heal the fence from damage resulting during formation.

12. The method of claim 9 further including a step of using stretchers to support the fence of dielectric material.

13. The method of claim 9 further including the step of forming the fence and electrode plates to have substantially high aspect ratios.

14. The method of claim 9 further including the step of using at least two different materials in the conductive layer.

15. The method of claim 9 further including the step of using at least one of polyimides; polytetrafluoroethylene, aerogels, aerogels, SiO$_2$, Si$_3$N$_4$, ONO, tantalum pentoxide and silicon oxynitride in the dielectric material.

16. A method for fabricating a vertical parallel plate capacitor, comprising the steps of:
   forming a sacrificial layer on at least a portion of a surface;
   conformally forming a dielectric layer on the sacrificial layer and an exposed portion of the surface;
   etching the dielectric layer so as to leave a fence of dielectric material along a sidewall of the sacrificial layer;
   removing the sacrificial layer;
   forming a conductive layer on the fence and surface;
   etching the conductive layer so as to form a first capacitor plate along one side of the fence, and a second capacitor plate along the other side of the fence, the first and second capacitor plates being substantially parallel to each other, and transverse sections of the capacitor plates including elongated portions substantially normal and integral to the surface.

17. The method of claim 16 further including an annealing step to heal the fence for damage caused during etching.

18. The method of claim 16 further including a step of using stretchers to support the fence of dielectric material.

19. The method of claim 16 further including the step of forming the fence and capacitor plates to have substantially high aspect ratios.

20. The method of claim 16 further including the step of using at least one of titanium, titanium alloys, tungsten, tungsten alloys, aluminum, aluminum alloys, copper, copper alloys, compound semiconductors and silicon in the conductive layer.

21. The method of claim 16 further including the step of using at least two different materials in the conductive layer, the at least two different materials being stacked so as to impart functional attributes of each respective material to the conductive layer.

22. The method of claim 16 further including the step of using at least one of polyimides; polytetrafluoerothylene, aerogels, $SiO_2$, $Si_3N_4$, ONO, tantalum pentoxide and silicon oxynitride in the dielectric material.

23. The method of claim 16 employed in combination with a method of forming multi-level interconnect structures of an integrated circuit.

24. The method of claim 16 further including a step of patterning the conductive layer prior to etching so as to form electrically conductive traces.

25. The method of claim 16 further including a step of using a plurality of stretchers to delineate at least two capacitor structures.

26. A vertical parallel plate capacitor, comprising:
    first and second electrode plates, the first electrode plate being substantially parallel to the second electrode plate along first and second common planes, the first common plane being substantially perpendicular to the second common plane; and
    a dielectric material interposed between the first and second electrode plates;
    wherein the first and second electrode plates are formed on an insulated substrate such that the first common plane is substantially normal to the insulated substrate.

* * * * *